(12) United States Patent
Kim

(10) Patent No.: US 6,388,485 B2
(45) Date of Patent: May 14, 2002

(54) DELAY-LOCKED LOOP CIRCUIT HAVING MASTER-SLAVE STRUCTURE

(75) Inventor: Kyu-hyoun Kim, Suwon (KR)

(73) Assignee: Samsung Electronics, Co., Ltd., Kyungki-do (KR)

( * ) Notice: Subject to any disclaimer, the term of this patent is extended or adjusted under 35 U.S.C. 154(b) by 0 days.

(21) Appl. No.: 09/808,024

(22) Filed: Mar. 15, 2001

(30) Foreign Application Priority Data

Mar. 16, 2000 (KR) .......................................... 00-13348

(51) Int. Cl.[7] ................................................ H03L 7/00
(52) U.S. Cl. ...................... 327/161; 327/236; 327/237; 327/243; 327/244
(58) Field of Search ................................ 327/155, 158, 327/159, 161, 233, 236, 237, 243, 244, 291, 292, 293, 297

(56) References Cited

U.S. PATENT DOCUMENTS

| | | | |
|---|---|---|---|
| 5,614,855 A | | 3/1997 | Lee et al. .................... 327/158 |
| 5,801,559 A | * | 9/1998 | Sawai et al. ................ 327/149 |
| 5,939,913 A | * | 8/1999 | Tomita ........................ 327/158 |
| 5,955,904 A | * | 9/1999 | Kawasaki ................... 327/156 |
| 5,973,525 A | * | 10/1999 | Fujii .......................... 327/158 |
| 5,990,715 A | * | 11/1999 | Nishimura ................. 327/158 |
| 6,194,930 B1 | * | 2/2001 | Matsuzaki et al. .......... 327/156 |

OTHER PUBLICATIONS

T.H. Lee et al.—A 2.5 V CMOS Delay–Locked Loop, etc . . . , Dec. 12, 1994; IEEE Journal of Solid State Circuits vol. 29, pp. 1491–1496.

* cited by examiner

Primary Examiner—Kenneth B. Wells
Assistant Examiner—An T. Luu
(74) Attorney, Agent, or Firm—Lee & Sterba, P.C.

(57) ABSTRACT

A delay-locked loop (DLL) circuit having a master-slave structure wherein the DLL circuit includes a master delay loop and a slave stage. The master delay loop delays an external clock signal by a predetermined delay time and generates a feedback signal which is phase-synchronized with the external clock signal. The slave stage delays the external clock signal by the predetermined delay time and generates an internal clock signal. The master delay loop includes a phase comparator, a delay controller, a delay part and a compensation delay part. The slave stage includes a low-pass filter and a slave delay part. The master delay loop may have a structure in which a plurality of delay parts are connected in series. According to the DLL circuit, the high frequency phase noise of the internal clock signal can be minimized in a locked state.

8 Claims, 5 Drawing Sheets

DELAY-LOCKED LOOP CIRCUIT HAVING MASTER-SLAVE STRUCTURE

BACKGROUND OF THE INVENTION

1. Field of the Invention

The present invention relates to an electronic circuit. More particularly, the present invention relates to a delay-locked looped (DLL) circuit for receiving an external clock signal and generating an internal clock signal.

2. Description of the Related Art

A synchronous semiconductor apparatus operates in synchronization with an external clock signal. Accordingly, a circuit for receiving the external clock signal and generating an internal clock signal having a phase that is synchronized with, or slightly leads, the phase of the external clock signal is required. A DLL circuit is usually used as such a circuit for generating an internal clock signal.

As shown in FIG. 1, a conventional DLL circuit 10 generally includes a phase comparator 12, a delay controller 14, a delay part 16 and a compensation delay part 18. The phase comparator 12 compares the phase of an external clock signal ECLK with the phase of a feedback signal FB and generates a detection signal DS corresponding to the phase difference between them. The delay controller 14 receives the detection signal DS and generates a delay control signal DCON for controlling a delay time of the delay part 16. The delay part 16 receives the external clock signal ECLK, delays the external clock signal ECLK in response to the delay control signal DCON, and generates an internal clock signal ICLK. The internal clock signal ICLK is delayed by a predetermined delay time by the compensation delay part 18 and output as the feedback signal FB. The feedback signal FB is input to the phase comparator 12 to be compared with the external clock signal ECLK. The above operation is repeated, and the DLL circuit 10 is locked when the phase of the feedback signal FB is synchronized with that of the external clock signal ECLK. Then, the internal clock signal ICLK which is completely synchronized with, or leads a little, the external clock signal ECLK, depending on the delay time set at the compensation delay part 18, is continuously generated.

In the conventional DLL circuit 10, the delay time of the delay part 16 continuously varies with the delay control signal DCON. Accordingly, the phase of the internal clock signal ICLK continuously and finely changes because a result obtained by comparing the phase of the external clock signal ECLK with that of the feedback signal FB and increasing or decreasing the delay time is usually reflected as a feedback signal FB after 1–2 clock periods. Thus, the phase of the internal clock signal ICLK continuously changes little by little even after the DLL circuit 10 is completely locked.

FIG. 2 is a graph illustrating a change in the delay control signal DCON in the conventional DLL circuit 10 of FIG. 1 when the delay control signal DCON is a digital code. The delay control signal DCON gradually increases and reaches a target. The target is the value of the delay control signal DCON in an ideal case where complete synchronization is achieved. In FIG. 2, the delay control signal DCON continuously and repeatedly increases and decreases slightly after it approaches the target. Accordingly, the phase of the internal clock signal ICLK repeatedly changes. The repetitive change in the phase results in a phase error in the internal clock signal ICLK or high frequency noise, exerting bad influence on the characteristics of the conventional DLL circuit 10.

In the typical DLL circuit 10, a low-pass filter may be added to the delay controller 14. The low-pass filter removes a high frequency component from the delay control signal DCON. In FIG. 2, a graph denoted by LDCON indicates a signal obtained by low-pass filtering the delay control signal DCON. As shown in FIG. 2, the low-pass filtered delay control signal LDCON is slower than the delay control signal DCON. Accordingly, the delay time and the phase of the internal clock signal ICLK changes more slowly. However, the delay time still continuously changes little by little.

As described above, a conventional DLL circuit has a problem in that the phase of an internal clock signal continuously changes as a delay control signal continuously changes even in a locked state.

SUMMARY OF THE INVENTION

In order to solve at least the above problem, it is a feature of an embodiment of the present invention to provide a delay-locked loop (DLL) circuit for minimizing the phase noise of an internal clock signal in a locked state.

Accordingly, in an effort to achieve the above and other features of an embodiment of the present invention there is provided a DLL circuit for receiving an external clock signal and generating an internal clock signal. In one embodiment, the DLL circuit includes a master delay loop for delaying the external clock signal by a predetermined delay time and then generating a feedback signal which is phase-synchronized with the external clock signal, and a slave stage for delaying the external clock signal by the predetermined delay time and generating the internal clock signal.

Preferably, the slave stage includes a low-pass filter for removing a high frequency component from a delay control signal used for controlling the delay time of the master delay loop and then generating a slave delay control signal, and a slave delay part for delaying the external clock signal by the delay time in response to the slave delay control signal and generating the internal clock signal.

In another embodiment, the DLL circuit includes a master delay loop for delaying the external clock signal by a predetermined first delay time and by a predetermined second delay time and generating a feedback signal which is phase-synchronized with the external clock signal, and a slave stage for delaying a signal, which is obtained by delaying the external clock signal by the predetermined first delay time, by the predetermined second delay time and generating the internal clock signal.

Preferably, the slave stage includes a low-pass filter for removing a high frequency component from a delay control signal used for controlling the predetermined second delay time of the master delay loop and generating a slave delay control signal, and a slave delay part for delaying a signal, which is obtained by delaying the external clock signal by the predetermined first delay time, by the predetermined second delay time in response to the slave delay control signal and generating the internal clock signal.

These and other features of the embodiments of the present invention will be readily apparent to those of ordinary skill in the art upon review of the detailed description of the preferred embodiments that follows.

BRIEF DESCRIPTION OF THE DRAWINGS

The above feature and advantage of an embodiment of the present invention will become more apparent by describing in detail preferred embodiments thereof with reference to the attached drawings in which.

DETAILED DESCRIPTION OF PREFERRED EMBODIMENTS

Figure 1:
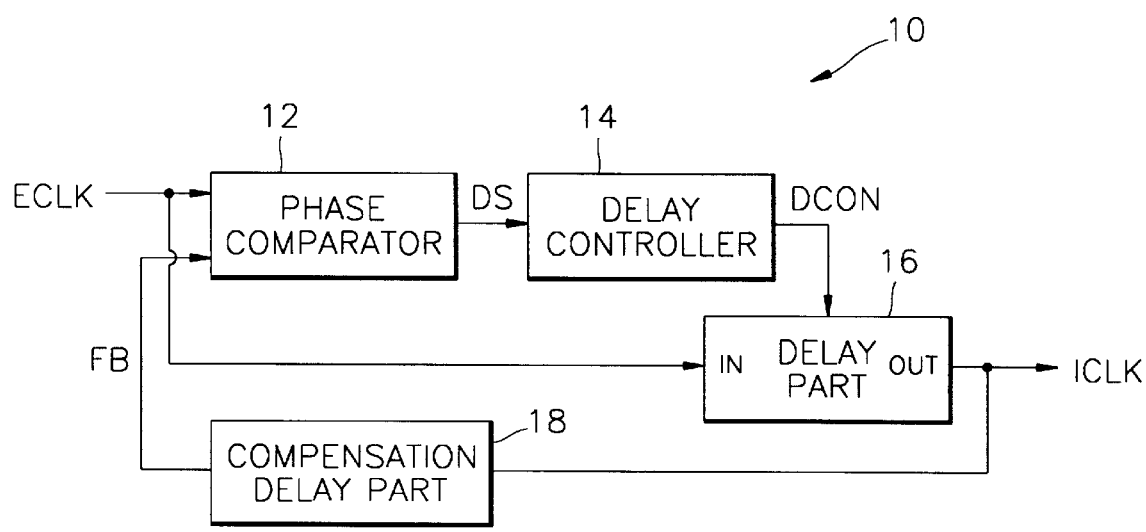
FIG. 1 illustrates a conventional delay-locked loop (DLL) circuit known in the prior art.
Figure 2:
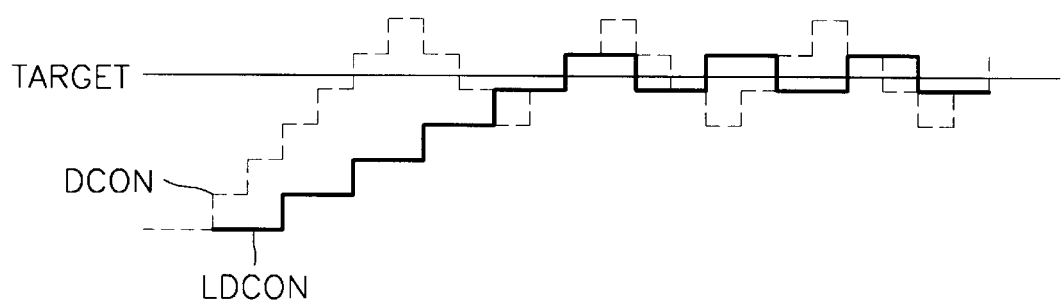
FIG. 2 is a graph illustrating a change in a delay control signal in the conventional DLL circuit of FIG. 1.

Korean Patent Application No.00-13348, filed on Mar. 16, 2000, and entitled: "Delay-locked Loop Circuit Having Master-slave Structure," is incorporated by reference herein in its entirety.

Hereinafter, embodiments of the present invention will be described in detail with reference to the attached drawings. For clarity of the description, in the drawings, the same reference numerals or characters denote the same members or signals performing the same functions.

Figure 3:
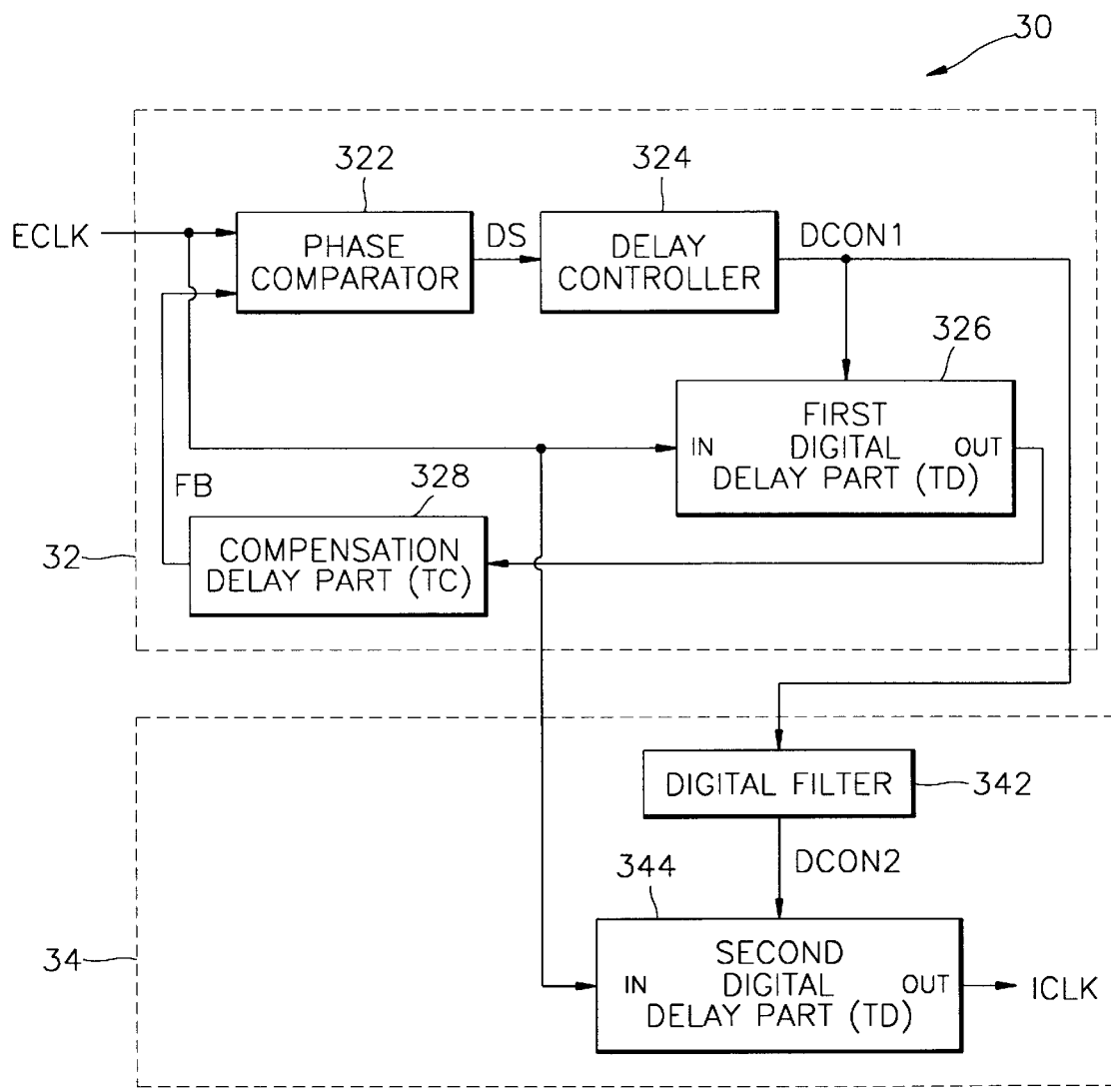
FIG. 3 illustrates a DLL circuit according to a first embodiment of the present invention.

FIG. 3 illustrates a delay-locked loop (DLL) circuit 30 employing a digital mode according to a first embodiment of the present invention. Referring to FIG. 3, the DLL circuit 30 includes a master delay loop 32 and a slave stage 34.

The master delay loop 32 delays an external clock signal ECLK by a predetermined delay time TD to finally generate a feedback signal FB whose phase is synchronized with the phase of the external clock signal ECLK. The slave stage 34 delays the external clock signal ECLK by the delay time TD to generate an internal clock signal ICLK. Preferably, the slave stage 34 includes a low-pass filter 342 and a slave delay part 344.

The master delay loop 32 in the DLL circuit 30 of FIG. 3 includes a phase comparator 322, a delay controller 324 and a first digital delay part 326. Preferably, the master delay loop 32 also includes a compensation delay part 328.

The low-pass filter 342 of the slave stage 34 is a digital filter, and the slave delay part 344 is a delay part employing a digital mode like the first digital delay part 326. Accordingly, the slave delay part 344 is referred to as a second digital delay part.

In the operation of the DLL circuit 30 of FIG. 3, the phase comparator 322 of the master delay loop 32 compares the phase of the external clock signal ECLK and the phase of the feedback signal FB and generates a detection signal DS corresponding to the phase difference between the external clock signal ECLK and the feedback signal FB. The delay controller 324 receives the detection signal DS and generates a first delay control signal DCON1. The first digital delay part 326 delays the external clock signal ECLK by the delay time TD in response to the first delay control signal. The compensation delay part 328 delays the output signal of the first digital delay part 326 by a compensation time TC to generate the feedback signal FB.

The digital filter 342 of the slave stage 34 removes a high frequency component from the first delay control signal DCON1 to generate a second delay control signal DCON2. The second digital delay part 344 delays the external clock signal ECLK by the delay time TD in response to the second delay control signal DCON2 to generate an internal clock signal ICLK. Here, the second delay control signal DCON2 can be referred to as a slave delay control signal for controlling the second digital delay part 344, i.e., the slave delay part.

Figure 4:
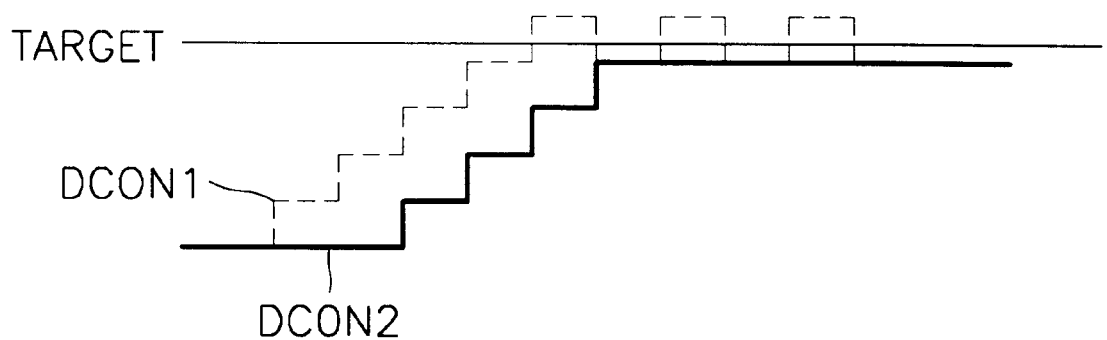
FIG. 4 is a graph illustrating a change in a delay control signal in the DLL circuit of FIG. 3.

FIG. 4 is a graph illustrating a change in the first delay control signal DCON1 and a change in the second delay control signal DCON2 in the DLL circuit 30 of FIG. 3. The entire operation of the DLL circuit 30 of FIG. 3 will be described with reference to FIG. 4.

Once the DLL circuit 30 starts the operation, the phase comparator 322 compares the phase of an external clock signal ECLK with the phase of a feedback signal FD and generates a detection signal DS. The detection signal DS is usually a pulse signal indicating an increase or a decrease depending on the leading and lagging relationship between the phases of the above two signals. It is assumed that when the detection signal DS is an increase signal, the first delay control signal DCON1 increases, and accordingly, the delay time TD becomes longer. The first delay control signal DCON1 is a digital code and may be a binary code composed of a plurality of bits.

Referring to FIG. 4, the first delay control signal DCON1 continuously increases at the initial operation stage of the DLL circuit 30 until it reaches a target. Here, the target is the value of the first delay control signal DCON1 when it is assumed that the phase of the external clock signal ECLK is exactly synchronized with the phase of the feedback signal FB. Accordingly, the target is the value of the first delay control signal DCON1 when it is assumed that the first delay control signal DCON1 is not a quantized digital code but an analog signal. If the first delay control signal DCON1 exceeds the target, it is controlled so as to be decreased. However, since the first delay control signal DCON1 is a quantized digital code, it is difficult for the first delay control signal DCON1 to become the same as the target. Accordingly, the first delay control signal DCON1 repeats an increase and a decrease with the target therebetween.

As shown in FIG. 4, the second delay control signal DCON2 obtained by low-pass filtering the first delay control signal DCON2 changes more slowly than the first delay control signal DCON1. Here, the digital filter 342 may be referred to as a type of decision logic for changing the second delay control signal DCON2 to be close to the first delay control signal DCON1 only when the difference between the second delay control signal DCON2 and the first delay control signal DCON 1 is equal to or larger than a predetermined reference. For example, the digital filter 342 may be a logic for increasing or decreasing the second delay control signal DCON2 only when the code value difference between the second delay control signal DCON2 and the first delay control signal DCON1 is equal to or larger than "2." Accordingly, when the second delay control signal DCON2 is not very different than the first delay control signal DCON1, the second delay control signal can be constantly maintained even if the first delay control signal DCON1 repeats an increase and a decrease.

As described above, by adding a slave stage including a low-pass filter and a slave delay part to a typical master delay loop, an internal clock signal ICLK not having high frequency phase noise can be obtained. Here, the phase of the internal clock signal ICLK leads the phase of the external clock signal ECLK by the delay time TC of the compensation delay part 328. If the delay time TC of the compensation delay part 328 is "0," the phase of the internal clock signal ICLK is completely synchronized with the phase of the external clock signal ECLK.

Figure 5:
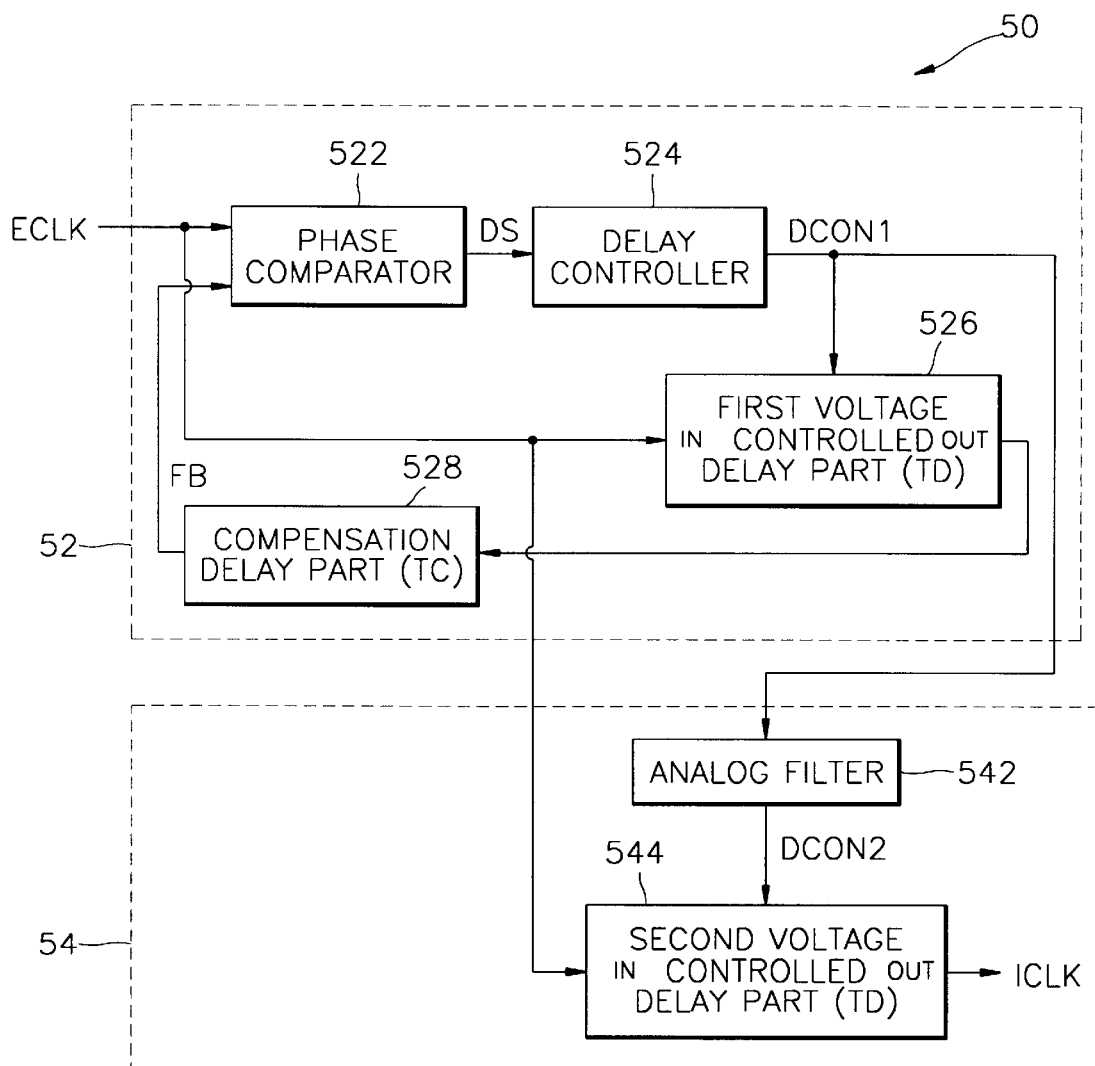
FIG. 5 illustrates a DLL circuit according to a second embodiment of the present invention.

FIG. 5 illustrates a DLL circuit according to a second embodiment of the present invention. The DLL circuit 50 of FIG. 5 employs an analog mode. Referring to FIG. 5, the DLL circuit 50 includes a master delay loop 52 and a slave stage 54.

The master delay loop 52 and the slave stage 54 perform the same functions as the master delay loop 32 and the slave stage 34, respectively, of FIG. 3, and thus a description thereof will be omitted. The slave stage 54 may include a low-pass filter 542 and a slave delay part 544, like the slave stage 34 of FIG. 3.

However, the DLL circuit 50 of FIG. 5 employs an analog mode. Accordingly, unlike the DLL circuit of FIG. 3, the master delay loop 52 of the DLL circuit 50 of FIG. 5 includes a phase comparator 522, a delay controller 524 and a first voltage controlled delay part 526. Preferably, the master delay loop 52 also includes a compensation delay part 528 as in the DLL circuit 30 of FIG. 3.

The low-pass filter 542 of the slave stage 54 is an analog filter, and the slave delay part 544 employs an analog mode like the first voltage controlled delay part 526. Accordingly, the slave delay part 544 of FIG. 5 is referred to as a second voltage controlled delay part.

The members of the DLL circuit 50 of FIG. 5 perform the same functions as the members of the DLL circuit 30 of FIG. 3, and thus a detailed description thereof will be omitted. However, since the DLL circuit 50 of FIG. 5 uses an analog mode, delay control and delay is performed according to an analog method unlike the digital DLL circuit 30 of FIG. 3. In other words, a first delay control signal DCON1 of FIG. 5 is an analog signal unlike the code type first delay control signal of FIG. 3. In addition, unlike the first digital delay part 326 of FIG. 3, a delay time TD of the first voltage controlled delay part 526 is adjusted by the voltage of the first delay control signal DCON1.

Figure 6:
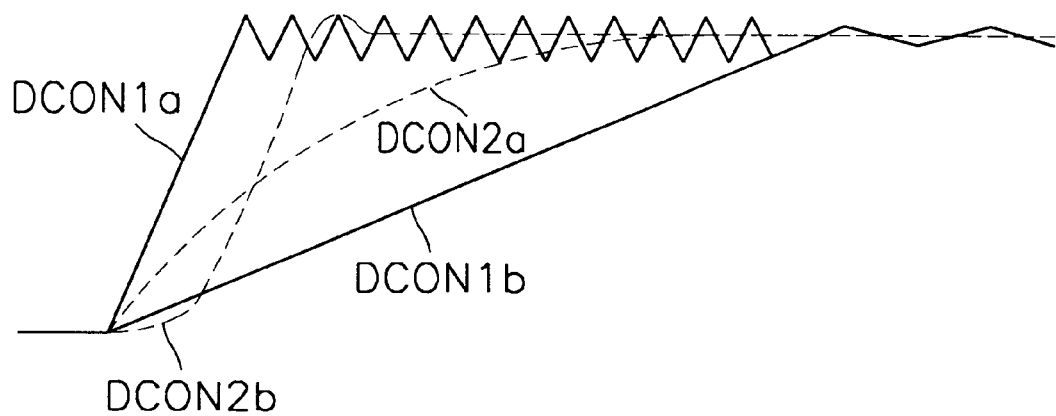
FIG. 6 is a graph illustrating a change in a delay control signal in the DLL circuit of FIG. 5.

FIG. 6 is a graph illustrating changes in the first and second delay control signals DCON1 and DCON2 in the DLL circuit 50 of FIG. 5. The entire operation of the DLL circuit 50 of FIG. 5 will be described with reference to FIG. 6.

At the initial operation stage of the DLL circuit 50, the first delay control signal DCON1 continuously increases until a feedback signal FB is synchronized with an external clock signal ECLK. Here, the increasing slope varies with the gain of the delay controller 524. In addition, the slope significantly influences a locking time. A charge pump is usually used as a delay controller of an analog DLL circuit. Accordingly, the increasing slope may vary with the gain of the charge pump. In FIG. 6, a line DCON1$a$ appears when the gain of the charge pump is large. In this case, synchronization between the feedback signal FB and the external clock signal ECLK is achieved within a short period of time. However, ripples in which an increase and a decrease are repeated appear even after the synchronization, and the magnitude of the ripples is large. To reduce the ripples, the gain of the charge pump may be lowered. A line DCON1$b$ appears when the gain of the charge pump is small. In this case, the magnitude of ripples is small, but it takes longer to achieve the synchronization.

Meanwhile, according to a second delay control signal DCON2 obtained by low-pass filtering the first delay control signal DCON1, the synchronization is achieved within a short period of time, and ripples can be removed after the synchronization, as shown in FIG. 6. Lines DCON2$a$ and DCON2$b$ are obtained by low-pass filtering the line DCON1$a$. The line DCON2$a$ indicates a signal that has been processed by a first order, low-pass filter, and the line DCON2$b$ indicates a signal that has been processed by a high order, low-pass filter. In the case of the line DCON2$a$, the increasing slope is slow, and the synchronization takes longer than in the case of the line DCON1$a$, but there is no ripple. On the contrary, in the case of the line DCON2$b$, the synchronization is achieved within a shorter period of time, but some ripples occur. However, the ripples of the line DCON2$b$ do not continuously appear like in the case of the line DCON1$a$. Accordingly, a synchronization time and high frequency noise can be simultaneously reduced by appropriately selecting the order of the analog filter 542.

Figure 7:
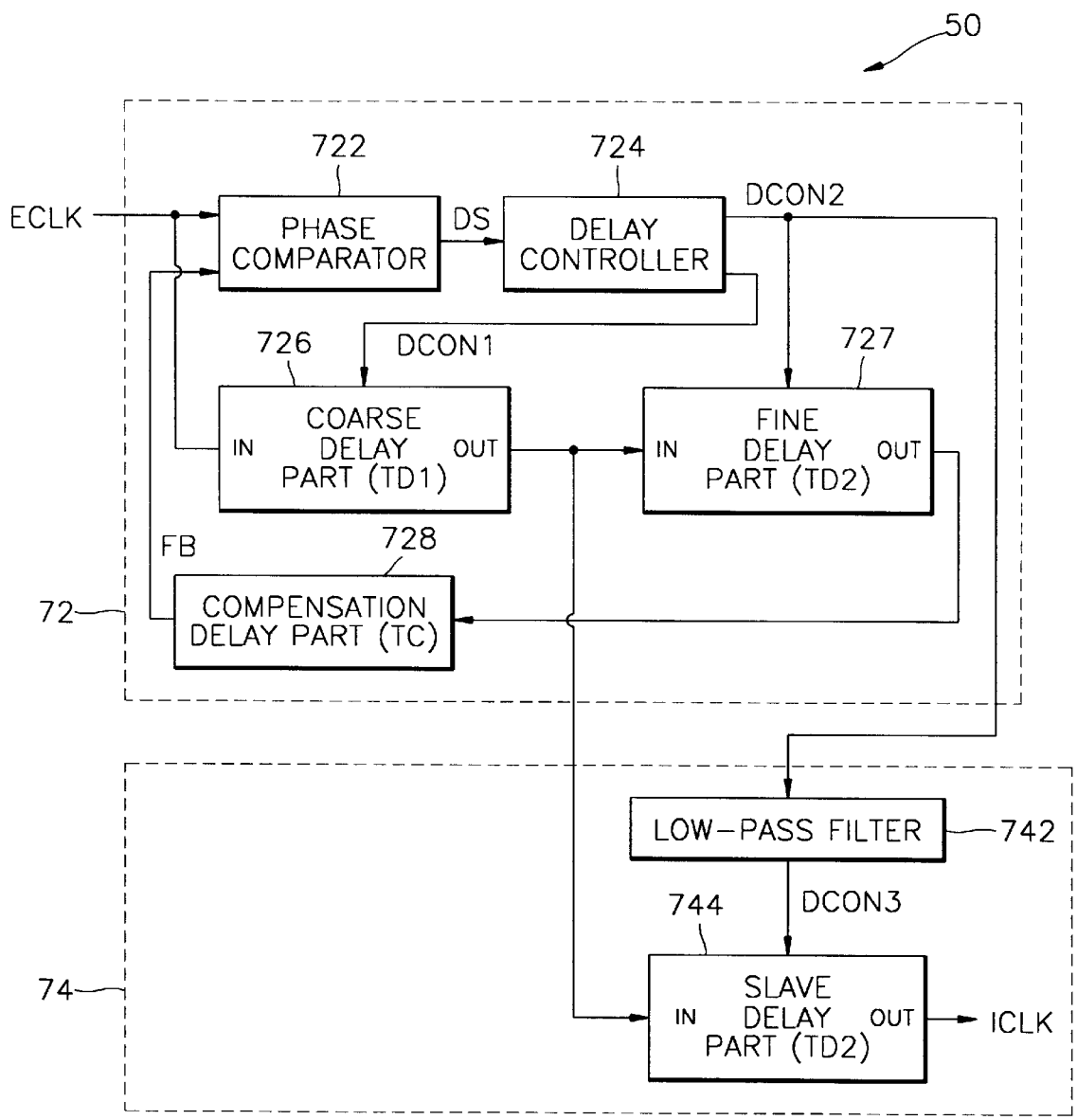
FIG. 7 illustrates a DLL circuit according to a third embodiment of the present invention.

FIG. 7 illustrates a DLL circuit according to a third embodiment of the present invention. Referring to FIG. 7, the DLL circuit 70 includes a master delay loop 72 and a slave stage 74.

The master delay loop 72 delays an external clock signal ECLK by a predetermined first delay time TD1 and by a predetermined second delay time TD2 to generate a feedback signal FB phase-synchronized with the external clock signal ECLK. The slave stage 74 delays a signal obtained by delaying the external clock signal ECLK by the first delay time TD1 by the second delay time TD2 to generate an internal clock signal ICLK.

The configuration of the DLL circuit 70 of FIG. 7 is similar to those configurations of the DLL circuits 30 and 50 of FIGS. 3 and 5, respectively, with the exception that the master delay loop 72 of the DLL circuit 70 of FIG. 7 has a hierarchical structure in which a plurality of delay parts are connected in series. In a DLL circuit having a hierarchical structure, usually, a coarse delay part having a relatively larger delay time interval and a fine delay part having a finer delay time interval are connected in series. Accordingly, for the convenience sake of the description, it is assumed that the master delay loop 72 includes two delay parts connected in series in this embodiment.

Therefore, it is preferable that the master delay loop 72 includes a phase comparator 722, a delay controller 724 and a first and a second delay part, 726 and 727. Here, the first delay part 726 is a coarse delay part, and the second delay part 727 is a fine delay part. Preferably, the master delay loop 72 also includes a compensation delay part 728. Here, the first and second delay parts 726 and 727 both may employ a digital mode or an analog mode. Alternatively, a digital-analog combined structure may be applied to the structure of the first and second delay parts 726 and 727. Therefore, it is apparent that delay parts can be configured using a multitude of combinations, and accordingly, the number of the delay parts is not restricted to two.

The delay controller 724 generates first and second delay control signals DCON1 and DCON2 for controlling the coarse delay part 726 and the fine delay part 727, respectively. The coarse delay part 726 delays the external clock signal ECLK by the first delay time TD1 in response to the first delay control signal DCON1 and generates a delay signal SDEL. The fine delay part 727 delays the delay signal SDEL by the second delay time TD2 in response to the second delay control signal DCON2 and generates and outputs a signal to the compensation delay part 728.

The slave stage 74 preferably includes a low-pass filter 742 and a slave delay part 744. The low-pass filter 742 removes a high frequency component from the second delay control signal DCON2 and generates a slave delay control signal DCON3. The slave delay part 744 delays the delay signal SDEL by the second delay time TD2 in response to the slave delay control signal DCON3 and generates an internal clock signal ICLK.

By using such a hierarchical structure as shown in the DLL circuit 70 of FIG. 7, the area and power consumption increasing due to a master-slave structure can be reduced. In other words, only a fine delay part is duplicated, and a coarse delay part is shared.

According to a DLL circuit of the present invention, the high frequency noise of an internal clock in a locked state can be minimized.

While the invention has been described in terms of preferred embodiments, it will be apparent to those of ordinary skill in the art that modifications may be made to the described embodiments without departing from the spirit and the scope thereof.

What is claimed is:

1. A delay-locked loop (DLL) circuit for receiving an external clock signal and generating an internal clock signal, comprising:

a phase comparator for comparing the phase of the external clock signal and the phase of a feedback signal and generating a detection signal corresponding to a phase difference between the external clock signal and the feedback signal, wherein the external clock signal is applied directly to the phase comparator;

a delay controller for receiving the detection signal and generating a first delay control signal;

a first digital delay part for delaying the external clock signal by a predetermined delay time in response to the first delay control signal and then generating the feedback signal, wherein the external clock signal is applied directly to the first digital delay part;

a digital filter for removing a high frequency component from the first delay control signal and generating a second delay control signal; and a second digital delay part for delaying the external clock signal by the predetermined delay time in response to the second control signal and generating the internal clock signal.

2. The delay-locked loop circuit of claim 1, further comprising a compensation delay part for receiving and delaying an output of the first digital delay part by a predetermined compensation delay time and then generating the feedback signal.

3. A delay-locked loop (DLL) circuit for receiving an external clock signal and generating an internal clock signal, comprising:

a phase comparator for comparing the phase of the external clock signal and the phase of a feedback signal and generating a detection signal corresponding to a phase difference between the external clock signal and the feedback signal, wherein the external clock is applied directly to the phase comparator;

a delay controller for receiving the detection signal and generating a first delay control signal;

a first voltage controlled delay part for delaying the external clock signal by a predetermined delay time based on the voltage of the first delay control signal and then generating the feedback signal, wherein the external clock is applied directly to the phase comparator;

an analog filter for removing a high frequency component from the first delay control signal and generating a second delay control signal; and a second voltage controlled delay part for delaying the external clock signal by the predetermined delay time based on the voltage of the second delay control signal and generating the internal clock signal.

4. The delay-locked loop circuit of claim 3, further comprising a compensation delay part for receiving and delaying an output of the first voltage controlled delay part by a predetermined compensation delay time and generating the feedback signal.

5. A delay-locked loop (DLL) circuit for receiving an external clock signal and generating an internal clock signal, comprising:

a phase comparator for comparing the phase of the external clock signal and the phase of a feedback signal and generating a detection signal corresponding to a phase difference between the external clock signal and the feedback signal;

a delay controller for receiving the detection signal and generating first and second delay control signals;

a coarse delay part for delaying the external clock signal by a predetermined first delay time in response to the first delay control signal and generating a delay signal;

a fine delay part for delaying the delay signal by a predetermined second delay time in response to the second delay control signal and then generating the feedback signal;

a low-pass filter for removing a high frequency component from the second delay control signal and generating a third delay control signal; and a slave delay part for delaying the delay signal by the second delay time in response to the third delay control signal and generating the internal clock signal.

6. The delay-locked loop circuit of claim 5, further comprising a compensation delay part for receiving and delaying an output of the first voltage controlled delay part by a predetermined compensation delay time and generating the feedback signal.

7. A delay-locked loop (DLL) circuit for receiving an external clock signal and generating an internal clock signal, comprising:

a master delay loop for delaying the external clock signal by a predetermined first delay time and by a predetermined second delay time and then generating a feedback signal which is phase-synchronized with the external clock signal; and a slave stage for delaying a clock signal, which is obtained by delaying the external clock signal by the predetermined first delay time in the master delay loop, by the predetermined second delay time and thereby generating the internal clock signal.

8. The delay-locked loop circuit of claim 7, wherein the slave stage comprises:

a low-pass filter for removing a high frequency component from a delay control signal used for controlling the predetermined second delay time of the master delay loop and generating a slave delay control signal, wherein the delay control signal is generated in the master delay loop; and a slave delay part for delaying a signal, which is obtained by delaying the external clock signal by the predetermined first delay time, by the predetermined second delay time in response to the slave delay control signal and generating the internal clock signal.

* * * * *